US009443568B2

United States Patent
Lu

(10) Patent No.: US 9,443,568 B2
(45) Date of Patent: Sep. 13, 2016

(54) ELECTRONIC DEVICE AND DATA TRANSMISSION METHOD THEREOF

(71) Applicants: INVENTEC (PUDONG) TECHNOLOGY CORPORATION, Shanghai (CN); INVENTEC CORPORATION, Taipei (TW)

(72) Inventor: Chun-Chieh Lu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 14/677,599

(22) Filed: Apr. 2, 2015

(65) Prior Publication Data

US 2016/0148658 A1    May 26, 2016

(30) Foreign Application Priority Data

Nov. 26, 2014 (CN) .......................... 2014 1 0692501

(51) Int. Cl.
*G11C 7/10* (2006.01)
(52) U.S. Cl.
CPC ................................. *G11C 7/1057* (2013.01)

(58) Field of Classification Search
CPC ........................................................ G11C 7/10
USPC ...................................... 365/189.011–225.7
See application file for complete search history.

(56) References Cited

U.S. PATENT DOCUMENTS 5,778,198 A * 7/1998 Kadota ............... G06F 13/4226
709/232

* cited by examiner

*Primary Examiner* — Harry W Byrne
(74) *Attorney, Agent, or Firm* — Huffman Law Group, PC

(57) ABSTRACT

An electronic device and a data transmission method thereof are provided. The electronic device includes a counter, a multiplexer, and a buffer. The counter counts the number of read times that the host device reads the electronic device, and produces a read time header corresponding to the number of read times. The multiplexer selects a piece of transmission data in a plurality of data to be transmitted according to the read time header. Each of the plurality of data to be transmitted corresponds to a different read time header related to the varied number of read times. The buffer buffers the read time header and outputs the read time header and the transmission data to the host device after receiving the transmission data. The host device decodes the read time header and the transmission data to obtain the selected data to be transmitted.

10 Claims, 3 Drawing Sheets

ELECTRONIC DEVICE AND DATA TRANSMISSION METHOD THEREOF

CROSS-REFERENCE TO RELATED APPLICATIONS

This non-provisional application claims priority under 35 U.S.C. §119(a) on Patent Application No(s). 201410692501.0 filed in China on Nov. 26, 2014, the entire contents of which are hereby incorporated by reference.

BACKGROUND OF THE INVENTION

1. Technical Field of the Invention

The disclosure relates to an electronic device and a data transmission method thereof, more particularly to an electronic device and a data transmission method thereof, which allows multiple-type data to be transmitted.

2. Description of the Related Art

Conventional serial general purpose input output (SGPIO) structure has to allocate a fixed number of time slots to a complex programmable logic device (CPLD) before performing data transmission.

After allocating the time slots, the SGPIO structure can not increase the number of types of data to be transmitted. The fixed number of time slots limits the types of data to be transmitted. For example, if a package can carry only 8 bits and the SGPIO structure transmits only 8 pieces of data, it may need more than one package to collect the entire data sometimes.

SUMMARY OF THE INVENTION

In an embodiment, an electronic device is coupled with a host device, receives a plurality of data to be transmitted, and includes a counter, a multiplexer, and a buffer. The counter counts the number of read times that the host device reads the electronic device, and produces a read time header corresponding to the number of read times. The multiplexer is electrically connected to the counter and selects a piece of transmission data in the plurality of data to be transmitted according to the read time header. Each of the plurality of data to be transmitted corresponds to a different read time header related to the varied number of read times. The buffer is electrically connected to the counter and an output terminal of the multiplexer, buffers the read time header, and outputs the read time header and the transmission data to the host device after receiving the transmission data. The host device decodes the read time header and the transmission data to obtain the selected data to be transmitted.

In another embodiment, the electronic device further includes a clock detector electrically connected to the counter. The clock detector determines whether the host device reads the electronic device, according to a clock signal provided by the host device.

In another embodiment, the counter produces the read time header according to a loading signal outputted by the host device.

In another embodiment, when the number of read times is equal to a default value, the counter resets the number of read times to zero and recounts the number of read times that the host device reads the electronic device.

In another embodiment, the number of time slots for the read time header and the transmission data is M, the number of time slots for the read time header is N, the default value is 2N−1, M and N are positive integers, and M is greater than N.

In an embodiment, a data transmission method is applied to the data transmission between an electronic device and a host device. The electronic device receives a plurality of data to be transmitted and is electrically connected to the host device. The data transmission method includes the following steps. The electronic device counts the number of read times that the host device reads the electronic device, and produces a read time header according to the number of read times. The electronic device selects a piece of transmission data from the plurality of data to be transmitted according to the read time header. Each of the plurality of data to be transmitted corresponds to a different read time header related to the varied number of read times. The electronic device outputs the read time header and the transmission data to the host device. The host device decodes the read time header and the transmission data to obtain the selected data to be transmitted.

In another embodiment, before the electronic device counts the number of read times that the host device reads the electronic device, the data transmission method further includes determining whether the host device reads the electronic device, according to a clock signal outputted by the host device.

In another embodiment, the electronic device produces the read time header according to a loading signal outputted by the host device.

In another embodiment, when the number of read times is equal to a default value, reset the number of read times to zero and recount the number of read times that the host device reads the electronic device.

In another embodiment, the number of time slots for the read time header and the transmission data is M, the number of time slots for the read time header is N, the default value is 2N−1, M and N are positive integers, and M is greater than N.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
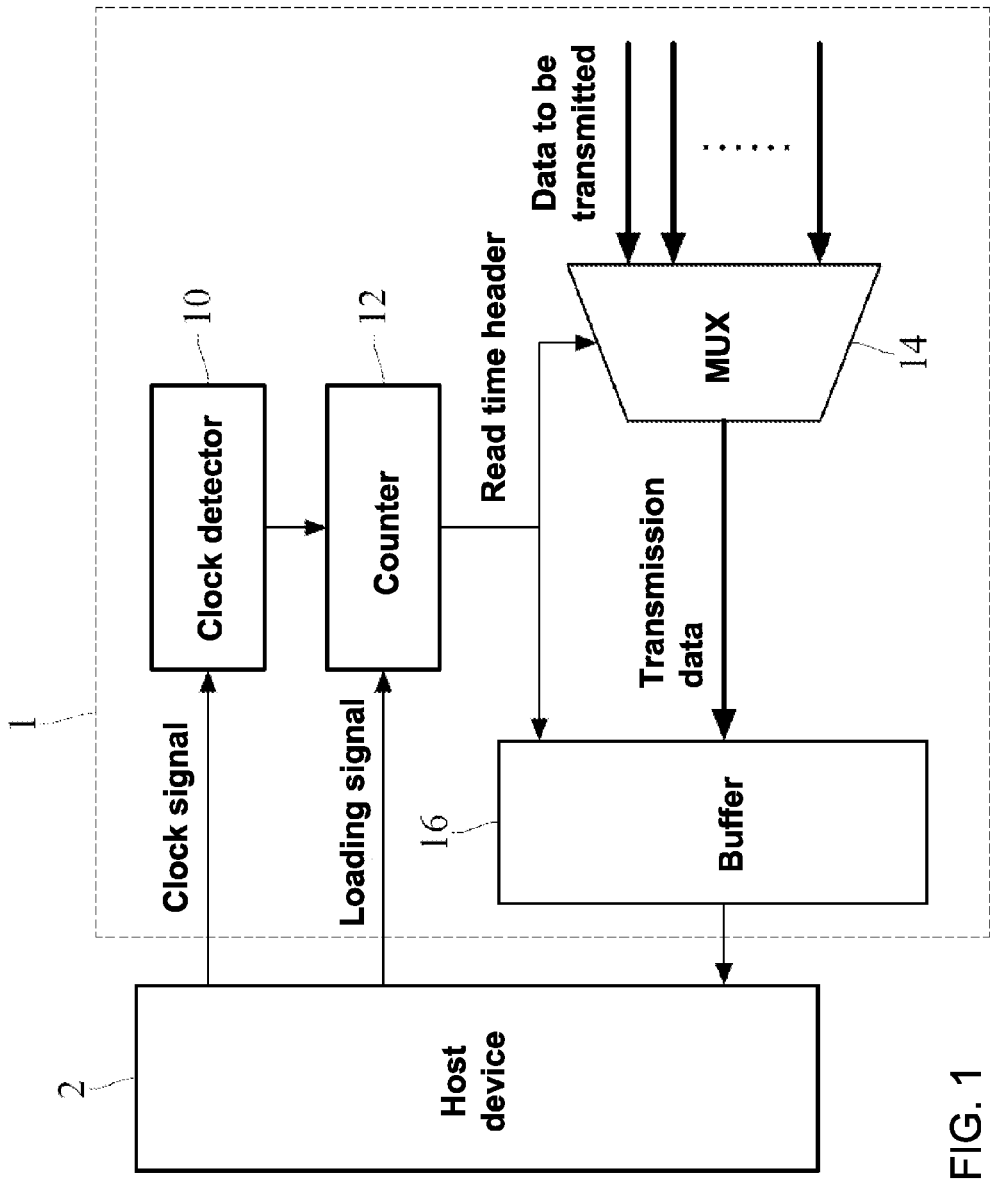
FIG. 1 is a functional block diagram of an electronic device according to an embodiment of the disclosure.

FIG. 1 is a functional block diagram of an electronic device according to an embodiment of the disclosure. An electronic device 1 receives a plurality of data to be transmitted and is electrically connected to a host device 2. The electronic device 1 includes a clock detector 10, a counter 12, a multiplexer 14, and a buffer 16. The clock detector 10 is electrically connected to the counter 12, and the counter 12 is electrically connected to a control terminal of the multiplexer 14 and the buffer 16. In practice, the electronic device 1 uses a serial general purpose input/output (SGPIO) interface to perform data transmission with the host device 2. For example, the host device 2 is considered as a SGPIO initiator while the electronic device 1 is considered as a SGPIO target.

The host device 2 is, for example, a baseboard management controller (BMC) or a central processing unit (CPU), but the disclosure will have no limitation on this example. For instance, the electronic device 1 is embodied by a field programmable gate array (FPGA) or a complex programmable logic device (CPLD), but the disclosure will have no limitation on this example. The host device 2 allocates a fixed number of time slots to the electronic device 1 for the data transmission. The operation of each component of the electronic device 1 is described in detail below.

The clock detector 10 receives a clock signal from the host device 2 and determines whether the host device 2 reads the electronic device 1, according to the clock signal. For example, the clock signal is a SClock signal based on the SGPIO structure. In practice, the clock detector 10 detects the variation of the clock signal, e.g. detecting the rising or falling edge of the signal, to determine whether the host device 2 is reading the electronic device 1, but the disclosure will have no limitation on this example.

The counter 12 receives a loading signal from the host device 2 and counts the number of read times that the host device 2 reads the electronic device 1. According to the number of read times, the counter 12 produces a set of read time headers. For example, the read time header is a string of binary digits that indicates how many times the host device 2 has read the electronic device 1. In an exemplary embodiment, when the number of read times indicates that the host device 2 reads the electronic device 1 for the first time, the counter 12 produces a read time header of "00" to indicate the number of read times; when the number of read times indicates that the host device 2 reads the electronic device 1 for the second time, the counter 12 produces a read time header of "01" to indicate the number of read times; and when the number of read times indicates that the host device 2 reads the electronic device 1 for the third time, the counter 12 produces a read time header of "10" to indicate the number of read times. In this way, the following number of read times and related read time header can be deduced by analogy. The disclosure will not be limited by the above exemplary embodiment of producing a read time header based on the number of read times.

Whenever the host device 2 reads the electronic device 1 once, the counter 12 will add 1 to the number of read times until the number of read times is equal to a default value. When the number of read times is equal to the default value, the counter 12 automatically resets the number of read times to zero, and then will recount the number of read times when the host device 2 reads the electronic device 1 next time. In other words, when the number of read times is equal to the default value, the number of read times will become zero and then is added up from zero. In practice, the counter 12 produces the read time header according to a loading signal outputted by the host device 2. For instance, the loading signal is a SLoading signal based on the SGPIO structure.

The multiplexer 14 has an input terminal to receive a plurality of data to be transmitted. Each of the plurality of data to be transmitted corresponds to a read time header related to the number of read times. The multiplexer 14 selects a piece of transmission data in the plurality of data to be transmitted according to the read time header. In an exemplary embodiment, when a control terminal of the multiplexer 14 receives a read time header of "00" indicating the host device 2 reads the electronic device 1 for the first time (i.e. the number of read times is 1), the multiplexer 14 selects the first data to be transmitted from the plurality of data to be transmitted according to the read time header of "00" and considers it as a piece of transmission data corresponding to the read time header of "00". When the control terminal of the multiplexer 14 receives a read time header of "11" indicating that the host device 2 reads the electronic device 1 for the fourth time (i.e. the number of read times is 4), the multiplexer 14 selects the fourth data to be transmitted from the plurality of data to be transmitted according to the read time header of "11" and sets it as the transmission data corresponding to the read time header of "11". The selection of the data to be transmitted corresponding to other read time headers can be deduced by analogy and will not described hereinafter.

The disclosure has no limitation in the content of the data to be transmitted. For instance, when the counter 12 counts that the host device 2 reads the electronic device 1 for the first time, to produce a read time header of "00", the multiplexer 14 selects the data indicating a power good state from the plurality of data to be transmitted according to the read time header of "00". When the counter 12 counts that the host device 2 reads the electronic device 1 for the second time, to produce a read time header of "01", the multiplexer 14 selects the data indicating an enable state from the plurality of data to be transmitted according to the read time header of "01".

The buffer 16 buffers the above read time header and after receiving the transmission data from the multiplexer 14, outputs the read time header and the transmission data to the host device 2. Therefore, the host device 2 can decode the read time header and the transmission data to obtain the selected data to be transmitted. For instance, the buffer 16 sends a frame including the read time header and the transmission data to the host device 2. The frame constructs a SDataIn signal based on the SGPIO structure. Because the host device 2 allocates a fixed number of time slots to the electronic device 1, the number of types of data that the electronic device 1 transmits to the host device 2 changes according to the number of time slots for the read time header. In other words, the allocation of time slots in the disclosure allows that the read time header functions as the header of data transmission (referred to as the header hereinafter), and the number of time slots for the header changes according to the number of read times added up by the counter 12. Accordingly, the number of time slots for the header and the number of time slots for the transmission data will not limit the disclosure.

Figure 2:
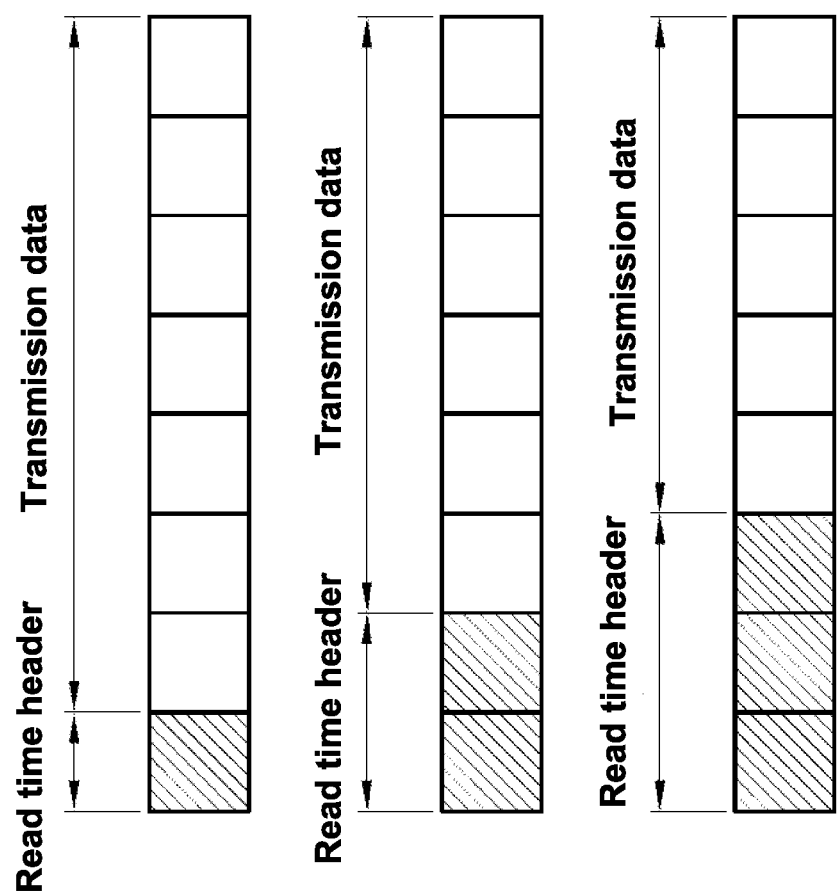
FIG. 2 is a schematic diagram of the allocation of time slots when the electronic device in FIG. 1 transmits data via a serial general purpose input/output interface according to an embodiment of the disclosure.

FIG. 2 is a schematic diagram of the allocation of time slots according to an embodiment of the disclosure when the electronic device in FIG. 1 transmits data via a SGPIO interface. In this exemplary embodiment, the allocation of time slots is based on an 8-bit SGPIO structure in FIG. 2. The host device 2 allocates 8 time slots to the electronic device 1. When the counter 12 counts up to 2 and chronologically produces the headers of "00" and "1" , the header occupies one of the 8 time slots and the transmission data occupies seven of the 8 time slots. When the counter 12 counts up to 4 and chronologically produces the headers of "00", "01", "10" and "11", the header occupies two of the 8 time slots and the transmission data occupies six of the 8 time slots. When the counter 12 counts up to 8 and chronologically produces the headers of "000", "001", "010", "011", "100", "101", "110" and "111", the header occupies three of the 8 time slots and the transmission data occupies five of the 8 time slots.

Accordingly, the header and the transmission data need M time slots in total as the header needs N time slots. M and N are positive integers, and the default value is 2N−1 if M is greater than N. As shown in FIG. 2, when M is 8, N is 1, 2 or 3. If N is 2, the header indicates 4 (i.e. $2^2$) types of data. If N is 3, the header indicates 8 (i.e. $2^3$) types of data. The values of M and N herein are the aforementioned maximum numbers of read times that counter 12 counts up to. Therefore, whenever the counter 12 counts up to 4 or 8, the counter 12 will reset the number of read times to zero and recount it. In this way, the electronic device 1 sequentially sends every type of data to the host device 2.

After the one or more time slots are assigned to the header, the rest of the time slots (i.e. the (M−N) time slots) are assigned to the data to be transmitted corresponding to each of the headers. Therefore, a single type of data to be transmitted can be transmitted through the rest of the time slots in a single package.

Accordingly, whenever the number of time slots for the header increases by one, the host device 2 needs to read the electronic device 1 more times. However, since the transmission of the data to be transmitted is usually carried out by a single package and the clock frequency of SGPIO structure nowadays is very high, the data transmission may not be delayed.

Since the electronic device 1 counts the number of read times that the host device 2 reads the electronic device 1, to automatically produce a header, the data transmission between the electronic device 1 and the host device 2 is performed without handshaking Furthermore, the host device 2 can directly decode the transmission data according to the header to obtain the selected data to be transmitted, so it is unnecessary to synchronize the electronic device 1 and the host device 2. The speed that the host device 2 obtains the selected data to be transmitted is based on the frequency for the host device 2 to read the electronic device 1.

Figure 3:
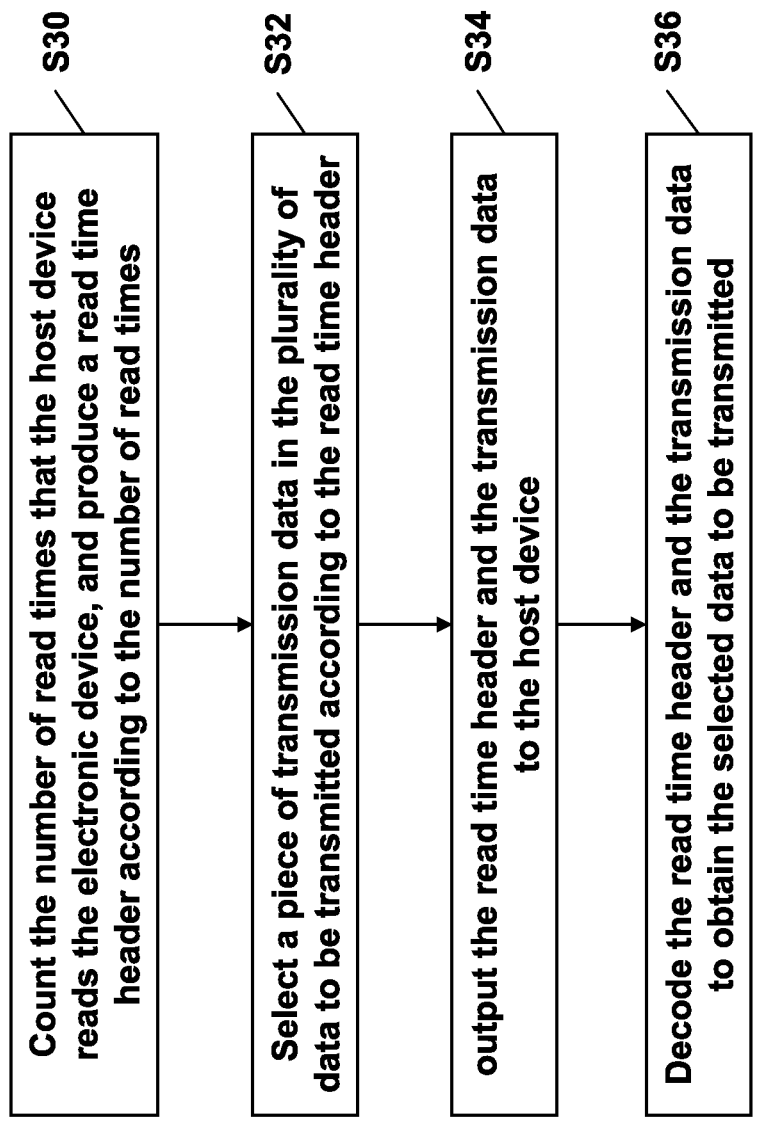
FIG. 3 is a flow chart of a data transmission method according to an embodiment of the disclosure.

Please refer to FIG. 1 and FIG. 3. FIG. 3 is a flow chart of a data transmission method according to an embodiment of the disclosure. The data transmission method is applied to the data transmission between the electronic device 1 and the host device 2, and the electronic device 1 receives a plurality of data to be transmitted and is electrically connected to the host device 2. The data transmission method includes the following steps.

In step S30, the electronic device 1 counts the number of read times that the host device 2 reads the electronic device 1, to produce a header. In step S32, the electronic device 1 selects a piece of transmission data corresponding to the header from the plurality of data to be transmitted. Each of the plurality of data to be transmitted corresponds to a header related to the number of read times. In step S34, the electronic device 1 sequentially outputs the header and the transmission data to the host device 2. In step S36, the host device 2 decodes the header and the transmission data to obtain the selected data to be transmitted.

When the number of read times counts up to a default value, the electronic device 1 resets the number of read times to zero and recounts the number of read times that the host device 2 reads the electronic device 1. The header and the transmission data need M time slots in total, the header needs N time slots, the default value is 2N−1, M and N are positive integers, and M is greater than N.

Moreover, before the electronic device 1 counts the number of read times that the host device 2 reads the electronic device 1 in step S30, the data transmission method further includes determining whether the host device 2 reads the electronic device 1, according to a clock signal provided by the host device 2. In step S30, the header is produced according to a loading signal provided by the host device 2.

As set forth above, the above electronic device uses the above data transmission method to appropriately allocate a number of time slots to the header according to the requirement of data transmission and the number of read times that the host device reads the electronic device. Therefore, the amount of types of data to be transmitted can increase or change, the host device can obtain more information through the same amount of time slots, and the data transmission between the electronic device and the host device progresses with headers but without handshaking.

What is claimed is:

1. An electronic device electrically connected to a host device, receiving a plurality of data to be transmitted, and the electronic device comprising:
   a counter for counting the number of read times that the host device reads the electronic device, and producing a read time header corresponding to the number of read times;
   a multiplexer electrically connected to the counter, for selecting a piece of transmission data in the plurality of data to be transmitted according to the read time header, wherein each of the plurality of data to be transmitted corresponds to a different read time header related to the varied number of read times; and
   a buffer electrically connected to the counter and an output terminal of the multiplexer, for buffering the read time header and outputting the read time header and the transmission data to the host device after receiving the transmission data,
   wherein the host device decodes the read time header and the transmission data to obtain the selected data to be transmitted.

2. The electronic device according to claim 1, further comprising: a clock detector electrically connected to the counter, for determining whether the host device reads the electronic device, according a clock signal outputted by the host device.

3. The electronic device according to claim 1, wherein the counter produces the read time header according to a loading signal provided by the host device.

4. The electronic device according to claim 1, wherein when the number of read times is equal to a default value, the counter resets the number of read times to zero and recounts the number of read times that the host device reads the electronic device.

5. The electronic device according to claim 4, wherein the number of time slots for the read time header and the transmission data is M, the number of time slots for the read time header is N, the default value is 2N−1, M and N are positive integers, and M is greater than N.

6. A data transmission method for data transmission between a host device and an electronic device that is electrically connected to the host device and receives a plurality of data to be transmitted, and the data transmission method comprising:
   counting the number of read times that the host device reads the electronic device, and producing a read time header according to the number of read times by the electronic device;

selecting a piece of transmission data in the plurality of data to be transmitted according to the read time header by the electronic device, wherein each of the plurality of data to be transmitted corresponds to a different read time header related to the varied number of read times;

outputting the read time header and the transmission data to the host device by the electronic device; and decoding the read time header and the transmission data to obtain the selected data to be transmitted by the host device.

7. The data transmission method according to claim 6, wherein before the electronic device counts the number of read times, the data transmission method further comprises determining whether the host device reads the electronic device, according to a clock signal provided by the host device.

8. The data transmission method according to claim 6, wherein the electronic device produces the read time header according to a loading signal outputted by the host device.

9. The data transmission method according to claim 6, further comprising: resetting the number of read times to zero and recounting the number of read times when the number of read times is equal to a default value.

10. The data transmission method according to claim 9, wherein the number of time slots for the read time header and the transmission data is M, the number of time slots for the read time header is N, the default value is 2N−1, M and N are positive integers, and M is greater than N.

* * * * *